(12) United States Patent
Malmberg et al.

(10) Patent No.: US 11,821,959 B2
(45) Date of Patent: Nov. 21, 2023

(54) METHOD FOR ESTIMATING STATE OF HEALTH OF A BATTERY

(71) Applicant: ALELION ENERGY SYSTEMS AB, Gothenburg (SE)

(72) Inventors: Simon Malmberg, Västra Frölunda (SE); Peter Tammpere, Mölndal (SE)

(73) Assignee: ALELION ENERGY SYSTEMS AB, Gothenburg (SE)

( * ) Notice: Subject to any disclaimer, the term of this patent is extended or adjusted under 35 U.S.C. 154(b) by 73 days.

(21) Appl. No.: 17/613,595

(22) PCT Filed: Jun. 3, 2020

(86) PCT No.: PCT/SE2020/050559
§ 371 (c)(1),
(2) Date: Nov. 23, 2021

(87) PCT Pub. No.: WO2020/246932
PCT Pub. Date: Dec. 10, 2020

(65) Prior Publication Data
US 2022/0244318 A1 Aug. 4, 2022

(30) Foreign Application Priority Data
Jun. 3, 2019 (SE) .................................... 1950652-6

(51) Int. Cl.
*G01R 31/392* (2019.01)
*G01R 31/3835* (2019.01)
(Continued)

(52) U.S. Cl.
CPC ....... *G01R 31/392* (2019.01); *G01R 31/3835* (2019.01); *H01M 10/44* (2013.01); *H01M 10/48* (2013.01); *H02J 7/005* (2020.01)

(58) Field of Classification Search
None
See application file for complete search history.

(56) References Cited

U.S. PATENT DOCUMENTS

2013/0093384 A1 4/2013 Nyu et al.
2021/0234386 A1* 7/2021 Purkayastha ......... H01M 10/48

FOREIGN PATENT DOCUMENTS

EP      0 659 304 A1    6/1995
JP      11-329512 A     11/1999
(Continued)

OTHER PUBLICATIONS

International Search Report, issued in PCT/SE2020/050559, dated Sep. 15, 2020.
(Continued)

*Primary Examiner* — Jas A Sanghera
(74) *Attorney, Agent, or Firm* — Birch, Stewart, Kolasch & Birch, LLP (57) ABSTRACT

A method for estimating state of health (SOH) of an electric battery includes starting a charging of an electric battery with a charge current, measuring a voltage of the electric battery during the charging, determining a first point in time at which a minimum slope of the voltage curve during the charging occurs, determining a second point in time when the measured voltage of the electric battery equals a maximum charging voltage, determining a SOH-interval between the first point in time and the second point in time, estimating the state of health for the electric battery based on the SOH-interval. The advantage of the method is that an estimated value for the state of health of an electric battery is obtained in an easy and reliable way.

20 Claims, 5 Drawing Sheets

(51) Int. Cl.
  *H02J 7/00*      (2006.01)
  *H01M 10/44*     (2006.01)
  *H01M 10/48*     (2006.01)

(56)          References Cited

FOREIGN PATENT DOCUMENTS

JP      2001-332310 A    11/2001
JP       2011-75461 A     4/2011
JP       2013-68458 A     4/2013
JP      2014-206484 A    10/2014
WO      WO 94/07292 A1    3/1994
WO    WO 2018/122131 A1   7/2018

OTHER PUBLICATIONS

Leijen et al. "Use of Effective Capacitance Variation as a Measure of State-of-Health in a Series-Connected Automotive Battery Pack", IEEE Transactions On Vehicular Technology, Mar. 2018, vol. 67, No. 3, pp. 1961-1968, XP011679487.
Marongiu et al. "On-board capacity estimation of lithium iron phosphate batteries by means of half-cell curves", Journal of Power Sources, Elsevier, May 26, 2016, vol. 324, pp. 158-169, XP029624586.
Written Opinion of the International Searching Authority, issued in PCT/SE2020/050559, dated Sep. 15, 2020.

* cited by examiner

METHOD FOR ESTIMATING STATE OF HEALTH OF A BATTERY

TECHNICAL FIELD

The present invention relates to a method for estimation of state of health of electric batteries, and especially metal-ion and/or metal-air batteries, such as lithium-ion, in liquid or solid state, lithium-air and sodium-ion.

BACKGROUND ART

Electrical batteries are used more and more as energy storage in e.g. stationary energy systems and/or as an energy source in electrically driven vehicles.

For example lithium-ion battery popularity has increased thanks to its high energy density, low self-discharge rate and low maintenance. The battery pack is in many cases the most expensive component of electric vehicles and in certain applications the battery packs may need a sophisticated supervision and control system in order to protect the cells and function safely. This system is called the Battery Management System (BMS) and two of its many tasks is to calculate the available energy (SOC) and energy capacity degradation (SOH) of the battery.

The available energy of a battery, known as state of charge (SOC), is comparable to the fuel gauge of a vehicle powered by a combustion engine often given as a percentage of available energy in the battery where 100% represents a fully charged battery and 0% represents an empty battery. SOC is not directly measurable and therefore requires some type of estimation, often by using a mathematical model relying on other measurements of the battery.

State of health (SOH) is used as a numerical measure of how aged a battery is commonly defined as a percentage of the cells' present capacity in comparison to when the battery was new. Deterioration of battery cells leads to decreased performance and is an issue that limits battery lifetime and performance. This is a well-studied phenomenon and the deterioration process is complicated since multiple variables such as charge- and discharge rates, temperature and state of charge influence the aging rate.

The above mentioned problems will also be present also in other battery types, with the non-limiting examples of metal-ion and/or metal-air batteries, such as lithium-ion, in liquid or solid state, lithium-air and sodium-ion, whereby the method also is applicable thereto. A battery management system (BMS) with implemented SOH estimation allows for safe operation, efficient maintenance planning, more accurate predictions of future battery pack replacements as well as the possibility to analyse the connection between usage and aging.

There is no universal and reliable method to determine the SOH today and none of the methods used is fully satisfying and there is thus a need for improvements in this field.

SUMMARY

An object of this disclosure is to suggest an improved method for state of health estimation. A further object of this disclosure is to suggest a battery management system arranged to perform such a method.

The suggested method aims at determining two points in the charging process of the battery which can be used as boundary for measuring a well defined portion of the electrical charge capacity of the battery and that this portion is also representative for the overall capacity of the battery to store electrical charge. This measurement is then used to determine the SOH of the battery.

The objects of this disclosure are achieved by the method according to claim 1 and the battery management system according to claim 10. The other claims contain advantageous further developments of the method. The disclosure also relates to a computer program and a computer program product for performing the above method.

The method relates to estimating state of health (SOH) of an electric battery and comprises the steps of:
 starting a charging cycle of an electric battery with a charge current,
 measuring a voltage of the battery during the charging,
 determining a first point in time at which a minimum slope of the voltage curve during charging occurs,
 determining a second point in time when the measured voltage of the battery equals a maximum charging voltage threshold ($V_{Threshold}$),
 determining a SOH-interval between the first point in time and the second point in time,
 estimating the state of health for the electric battery based on the SOH-interval between the first and the second point in time.

With the disclosed method, a reliable value for the state of health of an electric battery can be estimated.

The method is partly based on the realization that the characteristics of the electric battery during the time interval between the first and the second point in time is indicative of the electric battery's state of health. Dependent on the charging circumstances different inputs can be used as indication of the SOH-interval. However, one exemplary indication is the electric charge the electric battery has received between the first and the second point in time. For a perfect battery which does not show any ageing tendencies, the electrical charge received by the battery during the time interval between the first and second point in time, should be equal from one charge cycle to another. In reality, a normal battery will have some ageing and thus the electrical charge received by the battery will be gradually reduced from one charge cycle to another proportional to the state of health of the battery.

The first point in time $t_1$ is when the maximum of the ratio between the change speed of charging amount $\Delta Q$ and the change speed of battery voltage $\Delta V$, or other expressed the maximum value of the derivate $\Delta Q/\Delta V$, during charging.

The second point in time $t_2$ is when the maximum charge voltage $V_{Threshold}$ is reached.

The interval between the first and the second points in time is defined as the SOH-interval and can e.g. be measured as time difference between the two points in time or amount of charged received between the two points in time.

A charging cycle is defined from a start of a charging of the electric battery until the battery is fully charged. The method however is not dependent on finishing the charging cycle, only that the charging cycle continue until the maximum charging voltage threshold has been reached.

The measured charged capacity between the first and the second point in time, i.e. the SOH-interval, can be used to determine the state of health of the battery by storing one or several such measurements and compare the present capacity with a reference value and/or a historically measured capacity. The SOH-interval can be expressed as a time interval or a charge amount. In a common special case, where the same, constant and known charge current is used, the capacity measurement can be simplified into measuring the SOH-interval in a time unit. This is given by the fact that electrical charge Q is the current I multiplied by the duration t in time, so that Q=I*t. For a constant charge current I, the amount of charge Q is directly proportional to the duration t. Thus, for a constant charge current the received electrical charge by the battery during the SOH-interval is reduced to be proportional to the duration of the SOH-interval.

In one exemplary embodiment of the method, the charge current is at least initially determined or measured. For example, can the charge current be determined and/or measured, such that it is verified that the charge cycle uses a constant charge current of a variable charge current. Some embodiments of the method can be set to only perform or continue the method if a constant charge current is determined. When the charge cycle uses a variable charge current, the charge current can be measured or determined continuously.

In one embodiment of the method the charge current is measured continuously to calculate dQ/dV and accumulated charge Q(t) based on varying current and voltage. The accumulated charge Q(t) can be the accumulated charge from the start of the charge cycle and/or between specific time intervals, e.g. the SOH-interval.

In one embodiment of the method the charge current is measured or determined continuously independently if it initially is determined that a constant charge current is used or not. One effect thereof is that it can be verified that a constant charge current has been used until the maximum charging voltage threshold has been reached.

In one exemplary embodiment of the method, the SOC is determined before the charging of the battery starts.

One exemplary effect thereof, is that it allows several optional variations of the method and interpretation of the state of health. For example, if the state of charge is above a state of charge threshold, a reliable value for the minimum slope of the voltage curve will be harder to obtain and the SOH-interval interval between the first point in time and the second point in time may be misleading. It is thus foreseen that the state of charge of the electric battery is e.g. between 80% and 20% or below 50%, or 40%, or 30% when the method is implemented.

In one exemplary embodiment of the method, the method comprises the method steps of; cancelling the method if the state of charge of the battery is above a predefined state of charge threshold. One exemplary effect thereof is that the method is only performed if it is deemed that a reliable result can be achieved.

In one exemplary embodiment of the method the estimated state of health value is classified dependent on the state of charge of the electric battery before the charging started. The state of health value and/or the input values thereof is thereby saved together with its classification and/or the state of charge when the charge cycle started. One exemplary effect thereof is that the historical data can be weighted dependent on the state of charge of the electric battery before the start of the charging.

In an exemplary embodiment of the method further comprises the method step of saving determined and/or measured and/or estimated data of a charging cycle at a memory.

The data collected e.g. determined, measured, estimated, can for example be voltage data/curves, current data/curves, first point in time, second point in time, SOH-interval, estimated state of health values.

In an exemplary embodiment of the method, the method further comprises the method step of forming historical data for the electric battery.

The stored data also referred to as historical data, can be used to form a historical state of health value. The historical data may comprise accumulation of several measurement intervals into a data set of SOH estimates. Independently of what data is stored, i.e. if it is the determined state of health value and/or the first point in time and second point in time and/or the SOH-interval, it will be referred to in the forthcoming text as historical data. The historical data can be used for evaluating the state of health of the battery with a higher degree of certainty and redundancy. The historical data comprises accumulation of several measurement intervals into a data set of SOH estimates.

The historical data can be used to determine the SOH of the battery using a statistical method. For example, a state of health trend can be determined from the historical data and/or an average value and/or a median value and/or mode value or a value where the relevance of the historical data has been weighted dependent on its age.

One exemplary embodiment of the method comprises the method steps of estimating a future state of health of the electric battery dependent on the historical data. One exemplary effect thereof is that predictive maintenance and change of the battery can be done.

One exemplary embodiment of the method comprises the method steps of comparing the latest estimated state of health value of a charging cycle with the historical data, and excluding the latest estimated state of health value if a difference from the historical data is above a difference threshold value. One exemplary effect thereof is when the latest determined state of health value and/or SOH-interval is discarded due to a large deviation from the historical data, a more reliable estimation of the state of health can be provided. This because values with a high deviation from the historical data can be suspected to have been determined during not sufficiently stable or normal conditions, for example extreme temperatures and/or instable charge current and/or voltage. It is also foreseen that the charging conditions such as temperature and/or charge current and/or voltage and/or disruption in charging can be monitored.

The electric battery may contain one or, typically, several battery cells. The disclosed method can be applied on any type of battery independent of number of battery cells. In a battery containing a plurality of cells, the method can be applied on individual cells, a selection of cells or on the battery as a whole.

The state of charge (SOC) gives a user an indication of the level of remaining energy in the battery. This is important in order to plan the usage and charging of an apparatus powered by the electric battery and to prevent deep discharge and overcharge of the electric battery which may result in damage to the electric battery. SOC is usually defined as the still available charge in relation to the capacity of the electric battery. However, the usable capacity of the electric battery can be defined in different ways. The electric battery has a rated capacity which is the nominal capacity set by the manufacturer. The usable capacity is often limited relative the rated capacity in order to prevent damage of the battery cells. The usable capacity of a battery of e.g. a hybrid electric vehicle can for example be limited between 15-85%. The SOC is not directly measurable and needs to be estimated. There are several known methods for estimating the SOC.

State of health (SOH) is a numerical value of the electric batteries condition compared to its ideal condition. 100% SOH means that the electric battery matches factory specifications and SOH is commonly calculated as:

$$SOH = \frac{Q_{Act}}{Q_{Nom}}$$

where $Q_{Act}$ and $Q_{Nom}$ stand for actual capacity and nominal capacity. The capacity fade of the battery is often used to define SOH, but also the energy fade can be used. The disclosed method is partially based on that the capacity of the battery is determined by the change in the measured time interval $t_{SOH}$, i.e.

$$SOH = \frac{t_{SOH\_Act}}{t_{SOH\_Nom}}$$

where $t_{SOH\_Act}$ and $t_{SOH\_Nom}$ stand for actual SOH-interval and nominal SOH-interval, where the actual SOH-interval can be the most recent SOH-interval determined and/or a historical SOH-interval made up of a number of predetermined number of most recent historical SOH-intervals.

When charging a lithium-ion battery, the optimal and most common method is called constant current-constant voltage (CC-CV) charging. In this charging method, the battery is initially charged with a constant current until the voltage reaches the maximum charging voltage threshold. The constant voltage phase is then initiated, and the charger supplies the battery with energy at the maximum charging voltage threshold until fully charged. The charging is complete when the current reaches below a minimum threshold. However, to perform the method of this disclosure the charging cycle must not be completed, only continue until the electric battery reaches the maximum charging threshold.

The ideal situation with a constant current is not always present, whereby a varied charging current is used. The disclosed method can be applied independent of constant or varying charging current is used.

The shape of the current and voltage curves change as the electric battery ages. As the state of health decreases, the duration of the constant current phase is reduced. Once the maximum charging voltage threshold has been reached, the charger continues to charge the electric batteries in a constant voltage mode. The charging current gradually decreases in this mode as the electric battery is fully charged.

One exemplary embodiment of the method comprises the method steps of estimating the state of health as a ratio between a measured SOH-interval and a nominal SOH-interval.

As measured SOH-interval the latest measurement and/or a SOH-interval derived from the historical data can be used.

One exemplary embodiment of the method further comprises the method steps of detecting if the charge current is constant or variable, and; selecting an estimation strategy for the state of health for the electric battery based thereon, i.e. if the battery is charged with a constant or a variable current.

One exemplary embodiment of the method foresees that if a constant charge current is detected, the method further comprises the method step of
  selecting a simplified estimation strategy, and thereby
  using the time between the first point in time and the second point in time as indicative for the SOH-interval, and
if a variable charge current (I) is detected;
  selecting a full estimation strategy, and thereby
  continuously measuring the charge current (I),
  using the charge amount between the first point in time and the second point in time as indicative for the SOH-interval.

One object of this disclosure is achieved through a battery management system for controlling and monitoring an electric battery, according to any of the embodiments of the method disclosed herein. Such a battery management system is adapted to:
  start a charging cycle of an electric battery,
  measure a voltage of the electric battery during the charging cycle,
  determine a first point in time at which a minimum slope of the voltage curve during charging occurs,
  determine second point in time when the measured voltage of the battery equals a threshold charging voltage,
  determine a SOH-interval between the first point in time and the second point in time,
  estimate the state of health for the electric battery based on the SOH-interval between the first and the second point in time.

The battery management system can be provided in a load, a battery or a battery charger, cloud based or even be distributed between several locations.

The battery management system can control the charging of the battery and monitor the ageing of the electric battery in a reliable way.

Another object of this disclosure is achieved through a computer program comprising program code means for performing all the steps of any one of the embodiments of the method disclosed herein, when said program is run on a computer. Computer should be interpreted in its widest form, i.e. the term computer comprises e.g. microchips, microcontroller, processors, CPU, in general or embedded form.

Another object of this disclosure is achieved through a computer program product comprising program code means stored on a computer readable medium for performing all the steps of any one of the embodiments of the method disclosed herein, when said program product is run on a computer.

BRIEF DESCRIPTION OF DRAWINGS

The method will be described in greater detail in the following, with reference to the attached drawings and exemplary embodiments, in which.

DETAILED DESCRIPTION

The embodiments of the method with and exemplary embodiments described in the following are to be regarded only as examples and are in no way to limit the scope of the protection provided by the patent claims.

Figure 1:
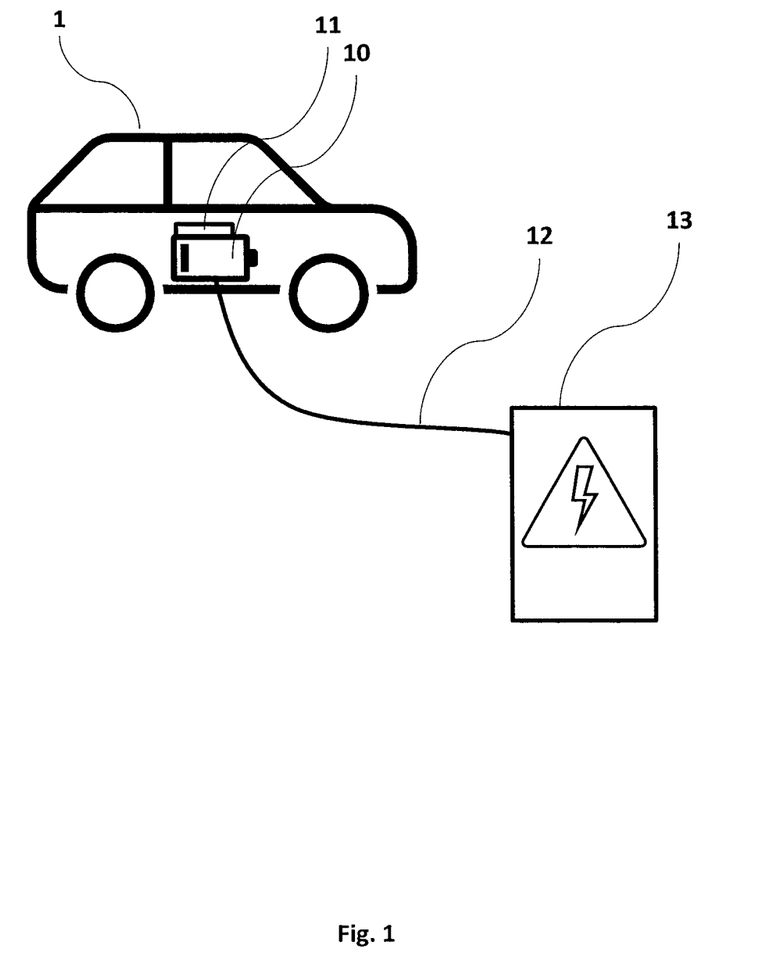
FIG. 1 shows an exemplary application for the disclosed method, FIG. 2 $a,b$ shows exemplary graphs for the charging current and the voltage of a battery during a charging cycle.

FIG. 1 shows an exemplary application for the disclosed method and battery management system. An electrical load 1 in FIG. 1 exemplified with a car comprises an electric battery 10. The battery 10 is not limited to but can be any one of the following metal-ion and/or metal-air batteries, such as lithium-ion, in liquid or solid state, lithium-air and sodium-ion. The electric battery 10 is provided with a battery management system 11, which is adapted to control and monitor the battery 10. The battery 10 is connected to a battery charger 13 via a charge cable 12. The disclosed method is applicable to electric batteries independent of its applications, i.e. independent of type of load 1 it is intended for. Furthermore, the method is applicable to wireless/contactless charging methods. In FIG. 1 the battery management system 11 is arranged upon the battery 10, the location of the battery management system 11 is however irrelevant for the application of the method, whereby the battery management system 10 could e.g. be remote, located in the charger or be distributed e.g. between a cloud, the battery 10 and the charger 13.

Figure 2A:
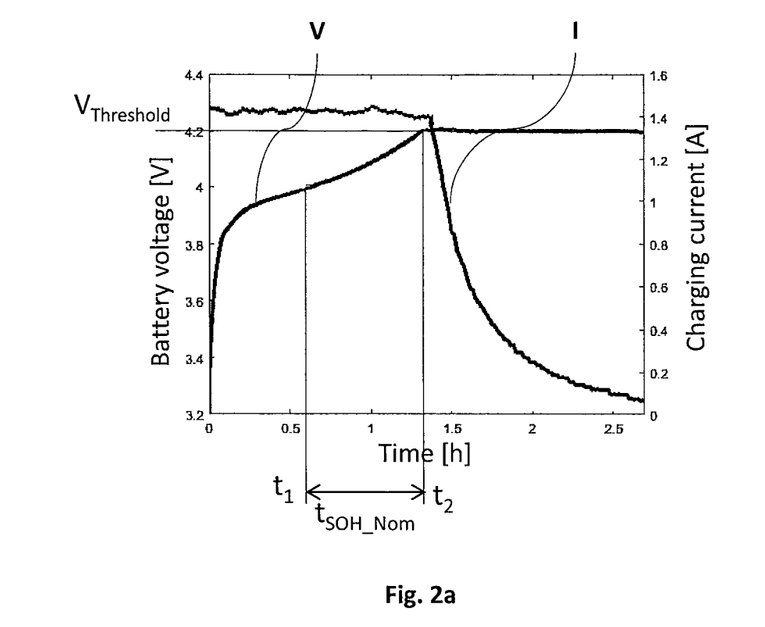
Figure 2B:
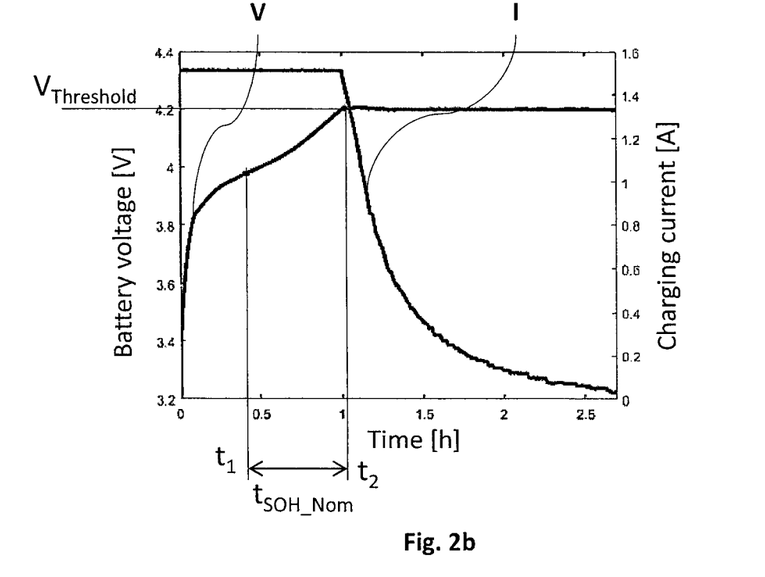

FIGS. 2a and 2b show graphs for the charging current I and the voltage V of a battery during a charging cycle. In the examples disclosed the voltage of the battery varies between about 3.2 volts for a more or less fully discharged battery to about 4.2 volts where the maximum allowed voltage of the battery at $t_2$ is reached, whereby the charging current I is decreased, i.e. the charging of the battery is controlled by keeping the voltage V constant.

Normally, the battery voltage V is not allowed to drop too much, and the use of the battery 10 is stopped at e.g. about 3.4 volts. E.g. at this voltage, the SOC may be around 20% for some lithium-ion anode-cathode material selections in the Li-ion battery family.

When the battery is charged, a charge current I is applied to the battery 10. The current can be variable as disclosed in the example FIG. 2a or constant as disclosed in the example in FIG. 2b. The method can be applied independent of if a constant charging current I or a variable charging current I is used.

As the charging current I is applied, the voltage V of the battery will increase as can be seen in FIGS. 2a and 2b. The voltage V increase is not linear, and the slope of the voltage curve V will at one point in time reach a minimum. This minimum slope of the voltage curve V occurs at $t_1$, which is the first point in time $t_1$. When the maximum charge voltage $V_{Threshold}$ is reached, the charging changes to maintain a constant voltage, whereby the current decreases over time, as can be seen in FIGS. 2a and b. The maximum charge voltage $V_{Threshold}$ is reached at $t_2$, which is the second point in time. This applies independently if a variable charging current I is applied as in the example of FIG. 2a or a constant charge current I is applied as in the example of FIG. 2b.

Figure 3:
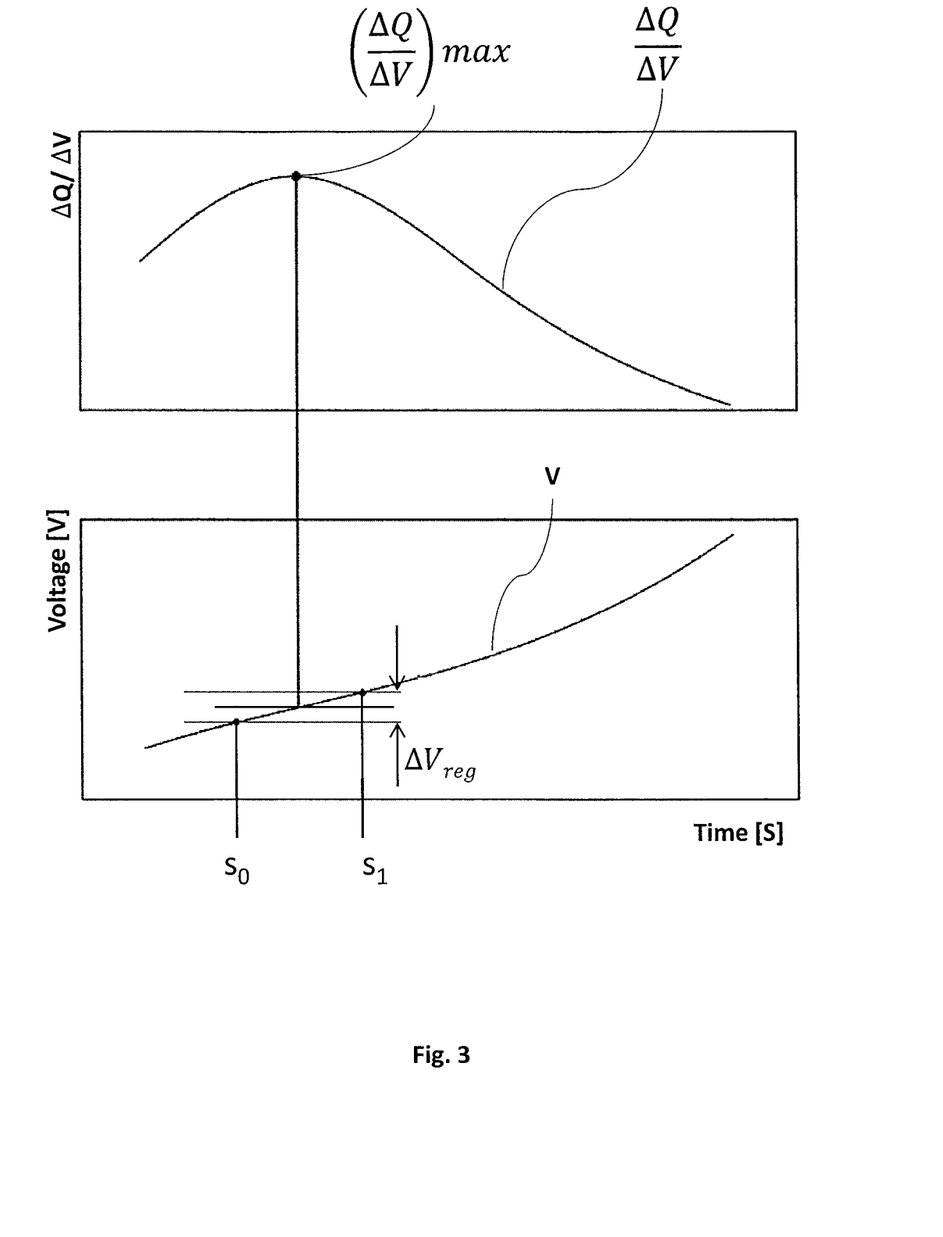
FIG. 3 shows an exemplary graph for the $\Delta Q/\Delta V$ of a battery during charging of a battery during a charging cycle.

FIG. 3 discloses an exemplary $\Delta Q/\Delta V$ curve above a voltage V curve. The minimum voltage slope may be obtained by dividing the change in the battery capacity $\Delta Q$ with the maximum change in the battery voltage $\Delta V$ over a period in time. The change in battery capacity $\Delta Q$ must be determined over a period in time and corresponds to the charge amount during that period in time. The period in time can be the last sampling interval $s_0$-$s_1$, or an interval comprising a plurality of sampling intervals $s_0$-$s_n$. The minimum slope method works within the mid ranges of SOC and can be implemented either through polynomial fitting, numerical differentiation or similar methods.

The electrical charge received by the battery between the first and the second point in time $t_1$, $t_2$ is denoted $Q_{t1,t2}$. Where the minimum slope of voltage occurs at the first point in time $t_1$ and the maximum charge voltage occurs at the second point in time $t_2$. The same measurement may e.g. be performed for the battery when it is new and may be saved in a memory as a nominal reference value $Q_{t1,t2\_Nom}$ for later comparison with an actual time measurement $Q_{t1,t2\_Act}$. The nominal reference value $Q_{t1,t2\_Nom}$ can alternatively be measured after a predetermined number of charging cycles or be a nominal value set for all batteries from the same production batch.

The State of Health for the actual charge cycle, i.e. a specific charge cycle becomes:

$$SOH = \frac{Q_{Act}}{Q_{Nom}} = \frac{Q_{t1,t2\_Act}}{Q_{t1,t2\_Nom}}$$

Electrical charge is determined as the time integral of the electrical current:

$$Q = \int I(t)dt$$

The electrical charge received by the battery between the two points in time voltage $t_1$ and $t_2$:

$$Q_{t1,t2} = \int_{t_1}^{t_2} I(t)dt$$

Both voltage and current of the battery are normally measured continuously during charging and the measurements are saved at discrete intervals at a specific sample period $T_s$, e.g. every second, every 10 seconds or at other suitable sample period. The sample period $T_s$ can be set dependent on the charge current, whereby the more varied the charge current is the shorter sample period becomes.

A numerical implementation acquires the measured electrical charge as:

$$Q_{t1,t2} = \sum_{k=t_1/T_s}^{t_2/T_s} I(kT_s)T_s$$

The nominal reference and actual measurements are acquired similarly:

$$Q_{t1,t2\_Nom} = \sum_{k=t_{1\_Nom}/T_s}^{t_{2\_Nom}/T_s} I(kT_s)T_s$$

$$Q_{t1,t2\_Act} = \sum_{k=t_{1\_Act}/T_s}^{t_{2\_Act}/T_s} I(kT_s)T_s$$

The state of health can be estimated as:

$$SOH = \frac{Q_{t1,t2\_Act}}{Q_{t1,t2\_Nom}}$$

In one exemplary embodiment a plurality of measurements $Q_{t1,t2_N}$ from different charge cycles are saved in a memory. If the latest determined time value differs too much from the historical data, it may be discarded. The saved measurements can be used to form historical data of a plurality of SOH estimates:

$$SOH_N = \frac{Q_{t1,t2_N}}{Q_{t1,t2\_Nom}}$$

The full historical data or part of the historical data, e.g. a predetermined number of the latest recordings of historical data can be compared to the nominal value in order to determine the ageing of the battery. For instance, the historical data can be used by statistical methods to determine a trend of SOH and use the calculated trend to make predictions of remaining lifetime of the battery.

If the charge current is known and constant, the capacity measurement can be simplified. Assuming that for each measurement N the charge current is $I_{c_N}$. The capacity measurement $Q_{t1,t2_N}$ becomes:

$$Q_{t1,t2_N} = \sum_{k=t2_N/T_s}^{t2_N/T_s} I(kT_s)T_s$$

$$= \sum_{k=t2_N/T_s}^{t2_N/T_s} I_{c_N}T_s$$

$$= I_{c_N}T_s\left(\frac{t_{2_N}}{T_s} - \frac{t_{1_N}}{T_s}\right)$$

$$= I_{c_N}(t_{2_N} - t_{1_N})$$

The SOH for the N:th measurement where the charge current is kept constant is calculated from:

$$SOH_N = \frac{Q_{t1,t2_N}}{Q_{t1,t2\_Nom}} = \frac{I_{c_N}(t_{2_N} - t_{1_N})}{I_{c_{Nom}}(t_{2\_Nom} - t_{1\_Nom})}$$

This can be further simplified if the same and constant charge current is used for all measurements, i.e.: $I_{c_N} = I_c$ and $I_{c\_Nom} = I_c$, where $$SOH_N = \frac{I_c(t_{2_N} - t_{1_N})}{I_c(t_{2\_Nom} - t_{1\_Nom})} = \frac{(t_{2_N} - t_{1_N})}{(t_{2\_Nom} - t_{1\_Nom})} = \frac{t_{SOH_N}}{t_{SOH\_Nom}}$$

By measuring the time interval between the minimum slope of voltage $t_1$ and the maximum charge voltage $t_1$, a determined SOH-interval $t_{SOH}=t_2-t_1$ is obtained that is indicative of the ageing factor of the battery or the state of health.

This SOH-interval $t_{SOH}$ may e.g. be measured for the battery when it is new and may be saved in a memory as a nominal reference value $t_{SOH\_Nom}$ for later comparison to an actual time measurement. The nominal reference value can alternatively be a nominal value set for all batteries from the same production batch.

Figure 4:
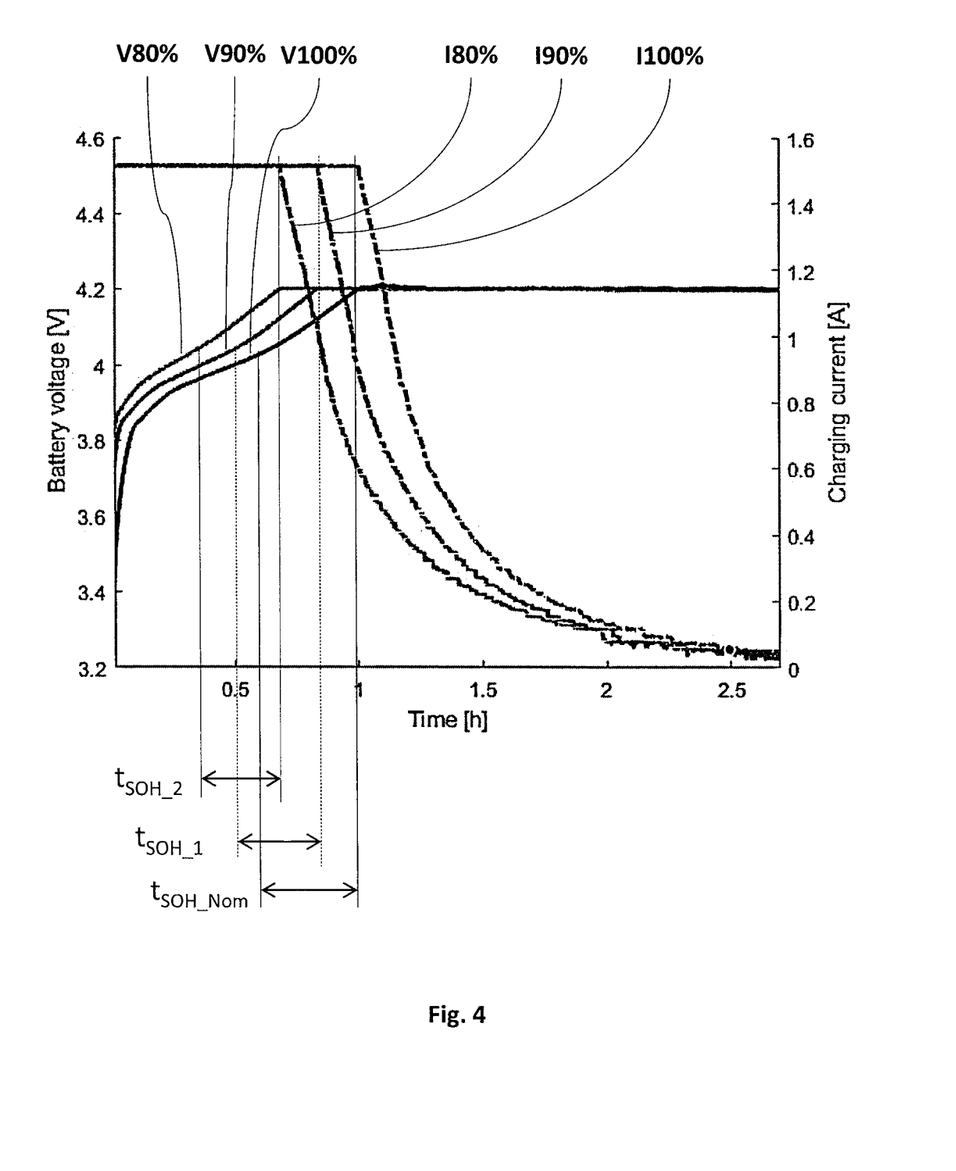
FIG. 4 shows exemplary graphs for the charging current and the voltage of a battery during a charging cycle at different state of health levels.

FIG. 4 discloses an example of three different charge cycles, for the same battery, when the battery is new V100%, I100%, when the state of health has been determined to 90% and when the state of health has been determined to 80%. From the curves three different SOH-intervals $t_{SOH}$; $t_{SOH_{Nom}}$; $t_{SOH_1}$ and $t_{SOH_2}$ can be determined, the $t_{SOH_{Nom}}$ is the nominal SOH-interval, $t_{SOH_1}$ corresponds to when the battery has a determined state of health of 90% and $t_{SOH_2}$ corresponds to when the battery has a determined state of health of 80%. The SOH can be determined according to:

$$\frac{t_{SOH_{Nom}}}{t_{SOH_{Nom}}} = 100\%$$

which is the reference measurement for SOH when the battery is new.

$$\frac{t_{SOH_1}}{t_{SOH_{Nom}}} = 90\% \text{ and } \frac{t_{SOH_2}}{t_{SOH_{Nom}}} = 80\%$$

represents later measurements representing when the SOH has degraded to 90% and 80% respectively.

In one exemplary embodiment of the method, the SOC is determined before the charging of the battery starts. One exemplary effect thereof, is that if the SOC is above a predefined value, a reliable value for the minimum slope of the voltage curve will be harder to obtain and the measured time interval between the first point in time $t_1$ and the second point in time $t_2$ may be misleading. It is thus foreseen that the SOC of the battery can be e.g. below 50%, or 40%, or 30% when the method is performed.

In one exemplary embodiment of the method, the method comprises the method steps of; cancelling the method if the state of charge of the battery (10) is above a predefined state of charge threshold. One exemplary effect thereof is that the method is only performed if it is deemed that a reliable result can be achieved.

In one exemplary embodiment the determined SOH-intervals $t_{SOH_N}$ are saved in a memory. The saved SOH-intervals $t_{SOH_N}$ can be used to form historical data of the SOH-interval $t_{SOH_N}$. The historical data can be used as a reference value for the latest measured time value. If the latest determined time value differs too much from the historical data, it may be discarded.

The full historical data or part of the historical data, e.g. a predetermined number of the latest recordings of historical data can be compared to the nominal value in order to determine the ageing of the electric battery.

The disclosed method is preferably used in a battery management system that may be integrated in e.g. a battery, an electrical load (e.g. vehicle, crane, lawn mower) and/or in a separate battery charger. The SOH-interval $t_{SOH_N}$ between the first point in time $t_1$ and the second point in time $t_2$, when the maximum charge voltage has been reached, may be measured at every charging cycle, a selected number of charging cycles in regular intervals or at arbitrary intervals and/or when a certain number of other charging conditions such as temperature, state of charge, accessible charge current, etc. can be met.

Figure 5:
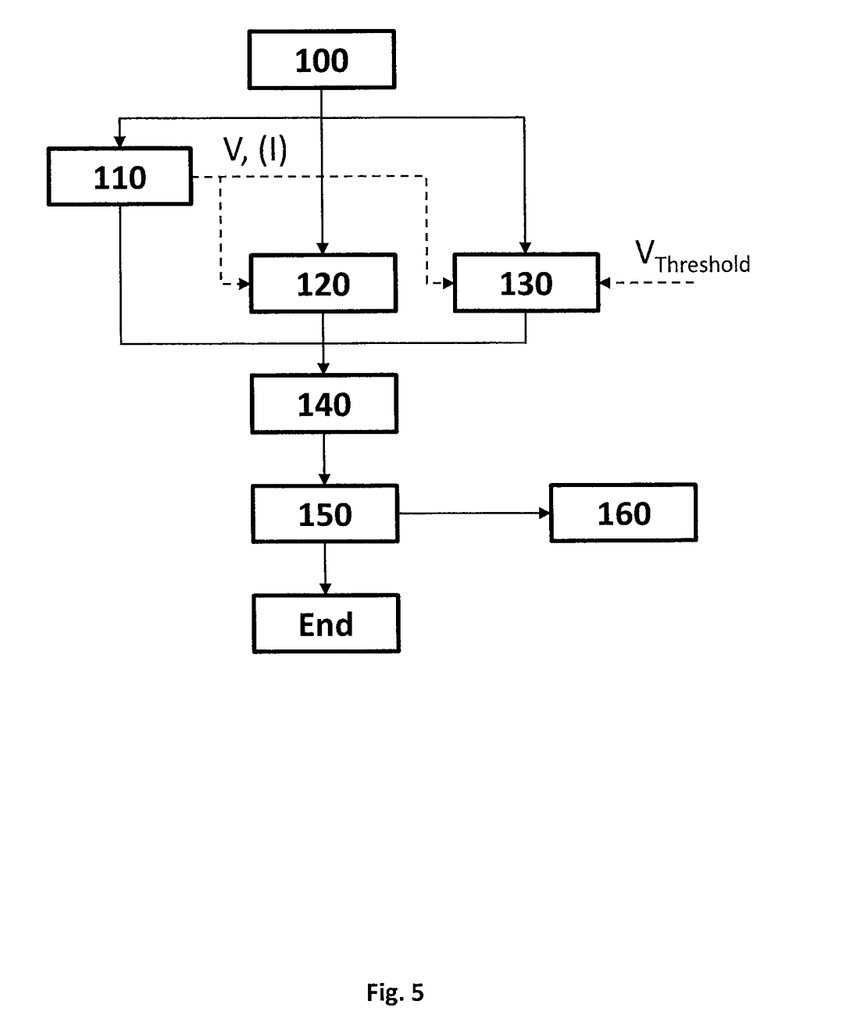
FIG. 5 shows a schematic flow chart of an inventive method for estimating the state of health of an electric battery.

FIG. 5 shows a schematic flow chart of an exemplary method for estimating state of health SOH of an electric battery.

In step 100, a charging cycle of the electric battery 10 with a charging current is started.

In step 110, the voltage V (and when applicable current I) of the battery 10 is (are) continuously measured, at least at predetermined sample intervals, (i.e. a plurality of measurements distributed over at least a portion of the charging cycle). Method step 120 and 130 uses the measured voltage V (and where applicable current I) from method step 110.

In step 120, the first point of time $t_1$ is determined. The first point in time $t_1$ is when the minimum slope of the voltage curve V, during the charging cycle occurs. The determination of the first point in time $t_1$ can be performed after the charging cycle has stopped or parallel with the charging cycle is going on.

In step 130, the second point in time $t_2$, where the charging voltage reaches the maximum charging voltage $V_{Threshold}$ is determined.

In step 140, the SOH-interval $t_{SOH}$ between the first point in time $t_1$ and the second point in time $t_2$ is determined. The SOH-interval $t_{SOH}$ can for example be determined in a time or in a charge received by the electric battery between the first and the second point in time $t_1$, $t_2$.

In step 150, the state of health for the electric battery based on the SOH-interval $t_{SOH}$ is estimated. The method is performed at least partially when the electric battery is charged, that is at least recordings current voltage data.

In an optional method step 160, the determined, estimated and/or measured data from the method is saved in a memory. As soon as any data determined, estimated, and/or measured has been captured, it can be saved through method step 160, even though method step 160 for simplicity reasons are only connected with method step 150.

The method steps are preferably performed by a computer program and a computer program product contained and run in the electronic control unit of a battery, a battery load and/or battery charger.

All the method steps 100-160 can comprise one or several sub-steps, without departing from the disclosed method. None limiting examples of sub-steps are:

Exemplary sub-step to method step 100:
  determining a state of charge of the electric battery (10) before starting the charging of the electric battery (10).
  cancelling the method if the state of charge of the battery (10) is above a predefined state of charge threshold.
  detecting if the charge current (I) is constant or variable, and;
  selecting an estimation strategy for the state of health for the electric battery (10) based thereon.

Exemplary sub-steps to method step 120:
  determining (121) the maximum value $$\left(\left(\frac{\Delta Q}{\Delta V}\right)\max\right)$$

of a ratio between the derivate of charging amount ($\Delta Q$) and derivate of charging voltage ($\Delta Q$) occurs.

Exemplary sub-steps to method step 150/160:
  forming historical data for the electric battery (10).
  comparing historical data with data from a current charge cycle and/or nominal data, and
  estimating the electric battery's state of health dependent on the comparison.
  estimating a future state of health of the electric battery dependent on the historical data.
  comparing a current estimated state of health value of a charging cycle with the historical data, and
  excluding the current estimated state of health value if a difference from the historical data is above a difference threshold value.

The disclosed method is not to be regarded as being limited to the exemplary embodiments described above, a number of additional variants and modifications being possible within the scope of the subsequent patent claims.

The invention claimed is:

1. A method for estimating state of health (SOH) of an electric battery, comprising the steps of:
  starting a charging cycle of an electric battery with a charge current (I),
  measuring a voltage (V) of the electric battery during the charging,
  determining a first point in time (t1) at which a minimum slope of the voltage curve (V) during the charging occurs,
  determining a second point in time (t2) when the measured voltage (V) of the electric battery equals a maximum charging voltage ($V_{Threshold}$),
  determining a SOH-interval ($t_{SOH}$) between the first point in time ($t_1$) and the second point in time ($t_2$), and
  estimating the state of health for the electric battery based on the SOH-interval ($t_{SOH}$).

2. The method according to claim 1, wherein the method further comprises the steps of;
  determining a state of charge of the electric battery before starting the charging of the electric battery.

3. The method according to claim 2, wherein the method further comprises the method step of:
  cancelling the method if the state of charge of the battery is above a predefined state of charge threshold.

4. The method according to claim 3, wherein the state of charge threshold of the battery is between 80 and 20% or 50% or 40% or 30%.

5. The method according to claim 1, wherein the method further comprises the step of:
  saving determined and/or measured and/or estimated data of a charging cycle at a memory.

6. The method according to claim 5, wherein the method further comprises the step of:
  forming historical data for the electric battery.

7. The method according to claim 6, wherein the method further comprises the step of:
  comparing historical data with data from a current charge cycle and/or nominal data, and
  estimating the electric battery's state of health dependent on the comparison.

8. The method according to claim 6, wherein the method further comprises the method step of:
  estimating a future state of health of the electric battery dependent on the historical data.

9. The method according to claim 6, wherein the method further comprises the steps of;
  comparing a current estimated state of health value of a charging cycle with the historical data, and
  excluding the current estimated state of health value if a difference from the historical data is above a difference threshold value.

10. The method according to claim 1, wherein the first point in time ($t_1$) is determined through the method step:
  determining the maximum value $$\left(\left(\frac{\Delta Q}{\Delta V}\right)\max\right)$$

of a ratio between the derivate of charging amount ($\Delta Q$) and derivate of charging voltage ($\Delta Q$) occurs.

11. The method according to claim 1, wherein the estimating of state of health is done by;
  estimating the state of health as a ratio between an actual SOH-interval ($t_{SOH_N}$) and a nominal SOH-interval ($t_{SOH_{Nom}}$).

12. The method according to claim 1, wherein the method further comprises the method step of:
  detecting if the charge current is constant or variable, and;
  selecting an estimation strategy for the state of health for the electric battery based thereon.

13. The method according to claim 12, wherein
  if a constant charge current is detected;
  selecting a simplified estimation strategy, and thereby using the time between the first point in time (t1) and the second point in time (t2) as indicative for the SOH-interval ($t_{SOH}$), and if a variable charge current is detected;

selecting a full estimation strategy, and thereby continuously measuring the charge current, using the charge amount ($Q_{t1,t2_N}$) between the first point in time ($t_1$) and the second point in time ($t_2$) as indicative for the SOH-interval ($t_{SOH}$).

14. A battery management system for controlling and monitoring an electric battery, wherein the battery management system is adapted to:

start a charging cycle of an electric battery, measure a voltage (V) of the electric battery during the charging cycle, determine a first point in time ($t_1$) at which a minimum slope of the voltage curve (V) during the charging cycle occurs, determine second point (t2) in time when the measured voltage (I) of the battery equals a threshold charging voltage, determine a SOH-interval ($t_{SOH}$) between the first point in time ($t_1$) and the second point in time ($t_1$), and estimate the state of health for the electric battery based on the SOH-interval-$t_{SOH}$) between the first and the second point in time ($t_1$, $t_2$).

15. A load, a battery or a charger comprising at least partially the battery management system according to claim 14.

16. A computer program embodied on a non-transitory computer readable medium and comprising program code means for performing all the steps of the method of claim 1, when said program is run on a computer.

17. A computer program product comprising program code means stored on a non-transitory computer readable medium for performing all the steps of the method of claim 1, when said program product is run on a computer.

18. The method according to claim 2, wherein the method further comprises the step of:

saving determined and/or measured and/or estimated data of a charging cycle at a memory.

19. The method according to claim 3, wherein the method further comprises the step of:

saving determined and/or measured and/or estimated data of a charging cycle at a memory.

20. The method according to claim 4, wherein the method further comprises the step of:

saving determined and/or measured and/or estimated data of a charging cycle at a memory.

* * * * *